(12) United States Patent
Tsao et al.

(10) Patent No.: US 11,769,778 B2
(45) Date of Patent: Sep. 26, 2023

(54) METHOD FOR FORMING LIGHT PIPE STRUCTURE WITH HIGH QUANTUM EFFICIENCY

(71) Applicant: Taiwan Semiconductor Manufacturing Company, Ltd., Hsin-Chu (TW)

(72) Inventors: Tsun-Kai Tsao, Tainan (TW); Jiech-Fun Lu, Madou Township (TW); Shih-Pei Chou, Tainan (TW); Tzu-Ming Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 58 days.

(21) Appl. No.: 17/406,297

(22) Filed: Aug. 19, 2021

(65) Prior Publication Data
US 2021/0384244 A1   Dec. 9, 2021

Related U.S. Application Data

(62) Division of application No. 16/405,027, filed on May 7, 2019, now Pat. No. 11,121,162.

(51) Int. Cl.
*H01L 27/146* (2006.01)

(52) U.S. Cl.
CPC .. *H01L 27/14625* (2013.01); *H01L 27/14612* (2013.01); *H01L 27/14636* (2013.01); *H01L 27/14643* (2013.01); *H01L 27/14685* (2013.01); *H01L 27/14689* (2013.01); *H01L 27/1463* (2013.01); *H01L 27/14621* (2013.01); *H01L 27/14627* (2013.01)

(58) Field of Classification Search
CPC ....................................... H01L 27/146–14893
See application file for complete search history.

(56) References Cited

U.S. PATENT DOCUMENTS

| | | | |
|---|---|---|---|
| 10,163,973 B2 | 12/2018 | Chang et al. | |
| 2015/0349015 A1* | 12/2015 | Yamaguchi | H01L 27/14603 438/70 |

(Continued)

OTHER PUBLICATIONS

Non-Final Office Action dated Oct. 16, 2020 for U.S. Appl. No. 16/405,027.

(Continued)

*Primary Examiner* — Suberr L Chi
(74) *Attorney, Agent, or Firm* — Eschweiler & Potashnik, LLC

(57) ABSTRACT

Various embodiments of the present disclosure are directed towards a method for forming an image sensor. The method includes forming a photodetector in a substrate. A lower interconnect portion of an interconnect structure is formed over the photodetector. A removal process is performed to define a first opening overlying the photodetector in the lower interconnect portion. A lower etch stop layer is formed lining the first opening. The lower etch stop layer has a U-shape in the first opening. An upper interconnect portion of the interconnect structure is formed over the lower etch stop layer. A light pipe structure is formed overlying the photodetector. The U-shape of the lower etch stop layer extends continuously along sidewalls and a bottom surface of the light pipe structure.

20 Claims, 9 Drawing Sheets

(56) References Cited

U.S. PATENT DOCUMENTS

| | | |
|---|---|---|
| 2015/0349018 A1 | 12/2015 | Takami |
| 2015/0349019 A1* | 12/2015 | Suzuki .............. H01L 27/14629 438/69 |
| 2016/0079294 A1* | 3/2016 | Tomimatsu ....... H01L 27/14629 257/231 |
| 2018/0269251 A1 | 9/2018 | Chang et al. |

OTHER PUBLICATIONS

Final Office Action dated Apr. 13, 2021 for U.S. Appl. No. 16/405,027.
Notice of Allowance dated May 14, 2021 for U.S. Appl. No. 16/405,027.

* cited by examiner

METHOD FOR FORMING LIGHT PIPE STRUCTURE WITH HIGH QUANTUM EFFICIENCY

REFERENCE TO RELATED APPLICATION

This application is a Divisional of U.S. application Ser. No. 16/405,027, filed on May 7, 2019, the contents of which are hereby incorporated by reference in their entirety.

BACKGROUND

Integrated circuits (IC) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
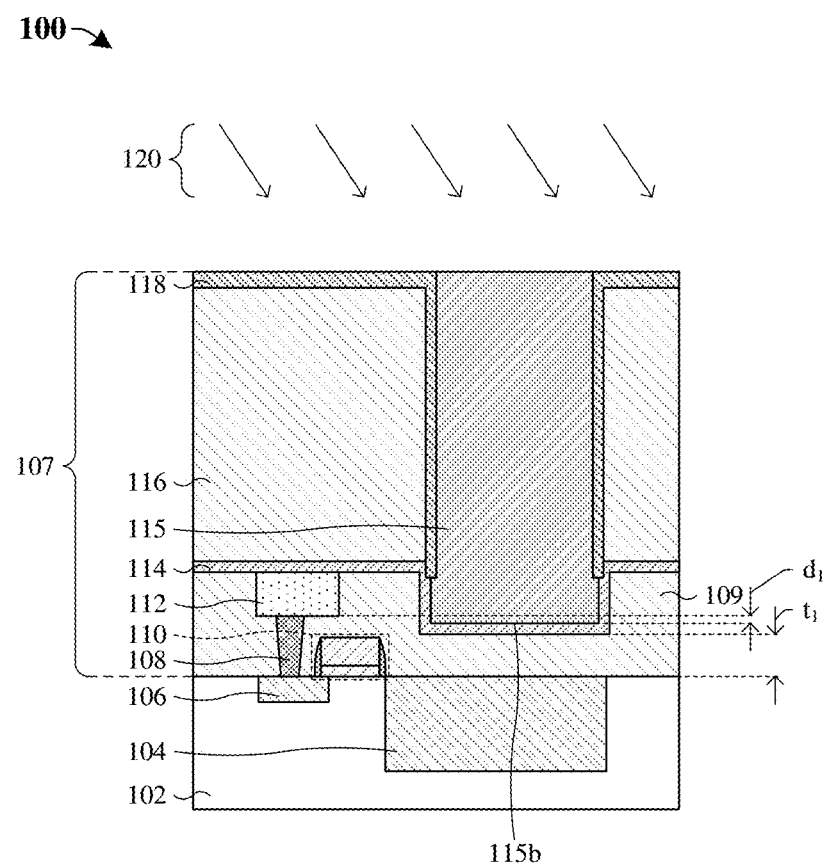
FIG. 1 illustrates a cross-sectional view of some embodiments of an image sensor comprising a light pipe structure overlying a photodetector, where a bottom surface of the light pipe structure extends below a bottommost conductive wire.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A front-side illumination (FSI) image sensor may, for example, comprise light pipe structures respectively overlying photodetectors. The light pipe structures are configured to guide incident radiation to underlying photodetector by total internal reflection (TIR), thereby increasing a quantum efficiency (QE) of the image sensor. The photodetectors are disposed within a semiconductor substrate. An interconnect structure overlies the semiconductor substrate. The interconnect structure comprises alternating stacks of wiring layers (e.g., horizontal routing) and via layers (e.g., vertical routing) disposed within an interconnect dielectric structure.

The light pipe structures may be formed by performing an etch process (e.g., a dry etch process) through the interconnect dielectric structure after the interconnect structure is fully or substantially formed, thereby forming an opening above each photodetector. Subsequently, the light pipe structures may be formed in the openings. However, the etch may, for example, be performed by a plasma etch with a high power and hence a high electric field strength because the openings extend deep into the interconnect structure. This may cause electrons to accumulate on the semiconductor substrate, thereby increasing dark current and/or a number of white pixels present in the image sensor. Further, physical bombardment from ions of the plasma may damage the interconnect dielectric structure and/or damage a crystalline structure of the semiconductor substrate, thereby reducing a structural integrity of the interconnect dielectric structure and/or further increasing the dark current and/or the number of white pixels. Furthermore, the high power and a long duration of the etch process causes a high variation in heights of the light pipe structures. Therefore, the light pipe structures each extend from a top of the interconnect structure to different points above the semiconductor substrate, such that each light pipe structure may have a different height. It has been appreciated that the difference in height across the light pipe structures may cause non-uniformity across the photodetectors (e.g., a first photodetector may receive less incident radiation than an adjacent second photodetector) and may decrease an overall QE of the image sensor.

Various embodiments of the present application are directed towards a method for forming a light pipe structure that increases the QE of the image sensor and decreases the dark current and/or the number of white pixels. In some embodiments, the method includes forming a lower interconnect portion of an interconnect structure over a photodetector and subsequently performing a first, low power etch into the lower interconnect portion to form an opening. A lower etch stop layer is formed lining the opening and has a U-shaped profile in the opening. An upper interconnect portion of the interconnect dielectric structure is formed over the lower etch stop layer and the lower interconnect portion. A second etch process is performed into the upper interconnect portion to form a light pipe opening overlying the photodetector. An upper etch stop layer is formed lining sidewalls of the light pipe opening. A wet etch process is performed to expand the light pipe opening and to remove excess material of the upper interconnect portion that overlies the lower etch stop layer. A light pipe structure is formed in the light pipe opening, such that a bottom surface of the light pipe structure is below a bottommost wiring layer of the interconnect structure. The use of the low power etch process to form the opening within which the lower etch stop layer is formed mitigates damage on a crystalline structure of the semiconductor substrate, thereby decreasing a dark current and/or a number of white pixels in the image sensor. Further, the wet etching process is able to form the light pipe opening while avoiding plasma damage that can occur during dry etching processes, thus mitigating the accumulation of electrons on the semiconductor substrate. Furthermore, the bottom surface of the light pipe structure extending below the bottommost wiring layer increases the QE and uniformity across the photodetectors in the image sensor.

With reference to FIG. 1, a cross-sectional view of some embodiments of an image sensor 100 comprising a light pipe structure 115 overlying a photodetector 104 is provided in which a bottom surface 115b of the light pipe structure 115 extends below a bottommost conductive wire 112.

The light pipe structure 115 overlies a photodetector 104 within a semiconductor substrate 102. In some embodiments, the semiconductor substrate 102 may be, for example, a bulk substrate (e.g., a bulk silicon substrate), a silicon-on-insulator (SOI) substrate, or some other suitable substrate having a first doping type (e.g., p-type). In further embodiments, the semiconductor substrate 102 may comprise three layers (e.g., silicon overlying an oxide and silicon underlying the oxide), such that a topmost layer in the three layers is epitaxial silicon with n-type doping. The photodetector 104 has a second doping type (e.g., n-type) opposite the first doping type. The photodetector 104 is configured to absorb incident radiation 120 (e.g., photons) and generate an electrical signal corresponding to the incident radiation 120. In some embodiments, a depletion region forms (e.g., due to p-n junctions between the photodetector 104 and adjacent doped regions of the semiconductor substrate 102) along a boundary of the photodetector 104.

A floating diffusion node 106 is disposed within the semiconductor substrate 102 laterally offset the photodetector 104. The floating diffusion node 106 is within the semiconductor substrate 102 having the second doping type (e.g., n-type). A transfer transistor 110 is disposed over the semiconductor substrate 102 laterally between the photodetector 104 and the floating diffusion node 106. The transfer transistor 110 may, for example, selectively form a conductive channel between the photodetector 104 and the floating diffusion node 106 to transfer accumulated charge in the photodetector 104 to the floating diffusion node 106. The accumulated charge may, for example, arises from absorbing the incident radiation 120.

An interconnect structure 107 overlies the semiconductor substrate 102. The interconnect structure 107 comprises conductive via(s) (e.g., a conductive contact 108), conductive wire(s) (e.g., the bottommost conductive wire 112), and dielectric layers and/or structures (e.g., a lower inter-level dielectric (ILD) structure 109). The lower ILD structure 109 overlies the semiconductor substrate 102 and the transfer transistor 110. The conductive contact 108 overlies the floating diffusion node 106 and extends through the lower ILD structure 109 to electrically couple the floating diffusion node 106 to the bottommost conductive wire 112. In some embodiments, silicide may be disposed between the conductive contact 108 and the semiconductor substrate 102 (not shown). A lower etch stop structure 114 is disposed between the lower ILD structure 109 and an overlying upper ILD structure 116. The lower etch stop structure 114 has a U-shape profile directly above the photodetector 104. An upper etch stop structure 118 extends through the upper ILD structure 116 to the lower etch stop structure 114.

A light pipe structure 115 extends from a top of the interconnect structure 107 to below a bottom surface of the bottommost conductive wire 112. In some embodiments, the light pipe structure 115 comprises a first dielectric material having a first refractive index (e.g., greater than 2.6), the lower etch stop structure 114 comprises a second dielectric material having a second refractive index (e.g., approximately 2.6), and the upper etch stop structure 118 comprises a third dielectric material having a third refractive index (e.g., approximately 2). In some embodiments, the first refractive index is greater than the second and third refractive indexes. By virtue of the first refractive index being greater than the second and third refractive indexes, the incident radiation 120 is confined to the light pipe structure 115 (e.g., due to total internal reflection) and is guided onto the photodetector 104. In addition, because the second and third indexes are less than the first refractive index, a majority of the incident radiation 120 disposed on the interconnect structure 107 directly above the photodetector 104 is guided to the light pipe structure 115 and refracted toward the photodetector 104.

The bottom surface 115b of the light pipe structure 115 extends below a top surface of the conductive contact 108 by a distance $d_1$. In some embodiments, the distance $d_1$ is within a range of about 50 to 1500 Angstroms. In some embodiments, if the distance $d_1$ is small (e.g., less than about 50 Angstroms), then a height of the light pipe structure 115 is decreased. This, in part, may reduce incident radiation 120 disposed upon the photodetector 104, thereby reducing a quantum efficiency (QE) of the image sensor 100. In further embodiments, if the distance $d_1$ is large (e.g., greater than about 1500 Angstroms), then physical bombardment (e.g., from ions of a plasma used during a formation of the light pipe structure 115) may damage the interconnect structure 107 and/or a crystalline structure of the semiconductor substrate 102. This, in part, may reduce a structural integrity of the interconnect structure 107, increase a dark current in the photodetector 104, and/or a number of white pixels in the image sensor 100. In further embodiments, the lower ILD structure 109 comprises a fourth dielectric material (e.g., an oxide, such as silicon oxide) having a fourth refractive index (e.g., approximately 1.46) less than the first refractive index. In yet further embodiments, the upper ILD structure 116 comprises an oxide having a fifth dielectric material with a refractive index of approximately 1.3.

In some embodiments, as seen in FIG. 1, the light pipe structure 115 extends continuously along substantially straight inner sidewalls of the upper etch stop structure 118. In further embodiments, a top surface of the light pipe structure 115 is substantially aligned with a top surface of the upper etch stop structure 118. An upper surface of the light pipe structure 115 is in direct contact with a bottom surface of the upper etch stop structure 118. The lower etch stop structure 114 continuously extends along and cups outermost sidewalls and the bottom surface 115b of the light pipe structure 115. In some embodiments, the outermost sidewalls of the light pipe structure 115 are laterally between outer sidewalls of the photodetector 104. The bottom surface 115b of the light pipe structure 115 may, for example, be separated from a top surface of the photodetector 104 by a lower segment of the lower etch stop structure 114 and the lower ILD structure 109. The light pipe structure 115 is recessed into the lower ILD structure 109, such that the bottom surface 115b of the light pipe structure 115 is below a top surface of the lower ILD structure 109. The lower ILD structure 109 continuously extends along and cups outermost sidewalls and the bottom surface 115b of the light pipe structure 115. The transfer transistor 110 is disposed laterally between the light pipe structure 115 and the conductive contact 108. The bottom surface 115b of the light pipe structure 115 is disposed laterally above the top surface of the transfer transistor 110. The light pipe structure 115 is laterally between an outer sidewall of the photodetector 104 and the transfer transistor 110.

Figure 2A:
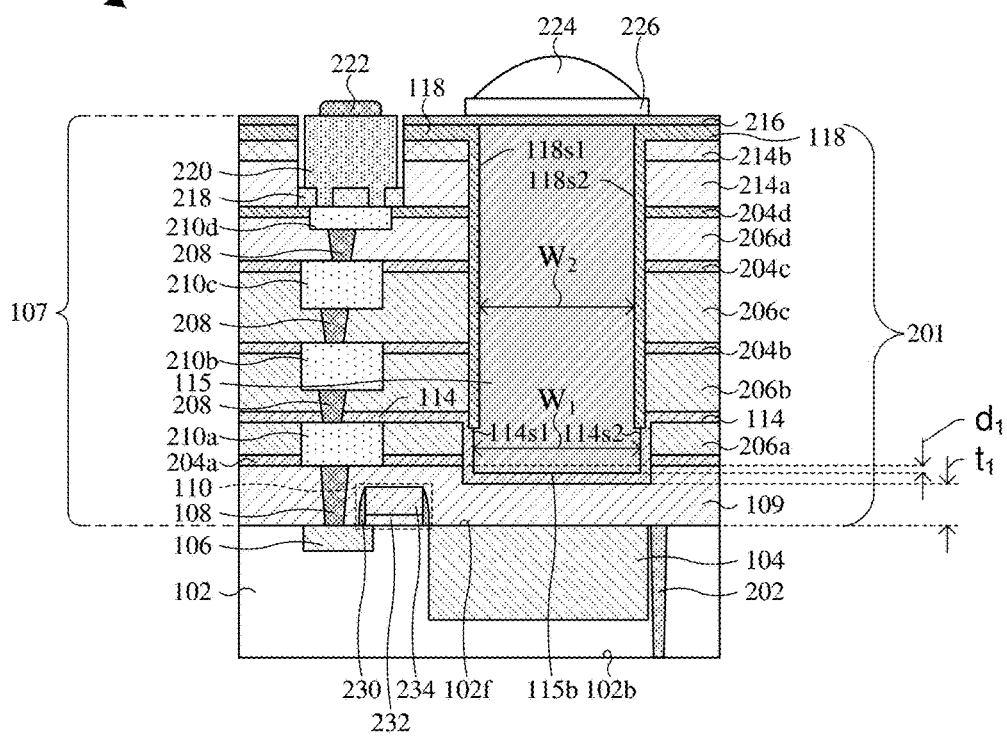
FIGS. 2A and 2B illustrate cross-sectional views of various alternative embodiments of the image sensor of FIG. 1 in which the image sensor further comprises a bond pad overlying a stack of conductive layers.

With reference to FIG. 2A, a cross-sectional view of an image sensor 200a according to some alternative embodiments of the image sensor 100 of FIG. 1 is provided, in which a bond pad 220 overlies the transfer transistor 110.

The image sensor 200a includes the interconnect structure 107 overlying the semiconductor substrate 102. A deep isolation structure 202 is disposed within the semiconductor substrate 102 adjacent to the photodetector 104. In some embodiments, the deep isolation structure 202 may, for example, be a shallow trench isolation (STI) structure, a deep trench isolation (DTI) structure, or the like. In further embodiments, the deep isolation structure 202 comprises a dielectric material and/or extends from a front side surface 102f of the semiconductor substrate 102 to a back side surface 102b of the semiconductor substrate 102. The deep isolation structure 202 is configured to electrically isolate the photodetector 104 from adjacent semiconductor devices (e.g., an adjacent photodetector) (not shown).

The transfer transistor 110 is disposed between the floating diffusion node 106 and the photodetector 104. In some embodiments, the transfer transistor 110 comprises a transfer gate electrode 234 overlying a transfer gate dielectric 232 and further comprises sidewall spacers 230 abutting the transfer gate electrode and dielectric 234, 232. In the aforementioned embodiment, a voltage may be applied to the transfer gate electrode 234 to control a transfer of accumulated charge (e.g., via absorbing incident radiation) in the photodetector 104 to the floating diffusion node 106.

The interconnect structure 107 overlies the front side surface 102f of the semiconductor substrate 102, such that the image sensor 200a may, for example, be configured as a front-side illumination (FSI) image sensor. In some embodiments, the interconnect structure 107 comprises the conductive contact 108, the bond pad 220, an interconnect dielectric structure 201, conductive wiring layers 210a-d, and conductive vias 208 disposed within the interconnect dielectric structure 201. The conductive contact 108 is disposed between a bottommost conductive wiring layer 210a and the floating diffusion node 106. The conductive vias 208 are disposed between the conductive wiring layers 210a-d. The interconnect dielectric structure 201 comprises a plurality of dielectric layers. The interconnect dielectric structure 201 includes the lower ILD structure 109, the lower etch stop structure 114, inter-wire buffer layers 204a-d, the upper etch stop structure 118, inter-metal dielectric (IMD) layers 206a-d, and passivation layers 214a-b. In some embodiments, a bottom surface of the upper etch stop structure 118 is disposed below an upper surface of a bottommost conductive wiring layer 210a.

In some embodiments, the lower ILD structure 109 may, for example, be or comprise one or more dielectric materials, such as an oxide, silicon oxide, a low-k dielectric, or the like, and/or may, for example, have a thickness within a range of about 2500 to 5000 Angstroms. As used herein, a low-k dielectric is a dielectric material that has a dielectric constant less than 3.9. In further embodiments, the lower etch stop structure 114 may, for example, be or comprise silicon carbide, or the like and/or may, for example, have a thickness within a range of about 200 to 500 Angstroms. In yet further embodiments, the inter-wire buffer layers 204a-c may respectively, for example, be or comprise silicon carbide, or the like and/or may respectively, for example, have a thickness within a range of about 200 to 500 Angstroms. In some embodiments, the upper etch stop structure 118 and the inter-wire buffer layer 204d may respectively, for example, be or comprise silicon nitride and/or may, for example, have a thickness within a range of about 250 to 750 Angstroms. In further embodiments, the IMD layers 206a-d may respectively, for example, be or comprise an oxide, silicon oxide, a low-k dielectric, or the like and/or may respectively, for example, have a thickness within a range of about 1000 to 3000 Angstroms. In yet further embodiments, the passivation layers 214a-b may respectively, for example, be or comprise an oxide, silicon oxide, a low-k dielectric, silicon nitride, or the like and/or may, for example, have a thickness within a range of about 500 to 2000 Angstroms. In some embodiments, the conductive contact 108, the conductive vias 208, and the conductive wiring layers 210a-d may, for example, be or comprise a metal material, such as copper, tungsten, aluminum, or the like.

The conductive vias 208 and the conductive wiring layers 210a-d extend through the interconnect dielectric structure 201 and facilitate electrical coupling between underlying contact regions (e.g., the floating diffusion node 106) and/or underlying semiconductor devices (e.g., the transfer transistor 110) and overlying metal layers (e.g., the bond pad 220). In some embodiments, the bond pad 220 may electrically couple an uppermost conductive wiring layer 210d to semiconductor devices disposed on an external device (not shown). A solder bump 222 is disposed over the bond pad 220 to facilitate coupling between the bond pad 220 and an external I/O pin of an integrated chip package. A pad dielectric layer 218 is disposed between the bond pad 220 and the uppermost conductive wiring layer 210d.

The conductive contact 108 overlies the floating diffusion node 106 and may facilitate the transfer of the charge at the floating diffusion node 106 to overlying metal layers (e.g., the bond pad 220). In some embodiments, a bottom surface of the conductive contact 108 is aligned with and directly contacts the front side surface 102f of the semiconductor substrate 102. In further embodiments, the bottom surface of the conductive contact 108 extends below the front side surface 102f of the semiconductor substrate 102 (not shown). In yet further embodiments, the bottom surface of the conductive contact 108 is above the front side surface 102f of the semiconductor substrate 102 and may be electrically coupled to the semiconductor substrate by way, for example, of a silicide, doped silicon, and/or polysilicon (not shown). The bottom surface 115b of the light pipe structure 115 extends below a top surface of the conductive contact 108. In some embodiments, a different conductive contact overlies the transfer gate electrode 234, such that the bottom surface 115b of the light pipe structure 115 extends below a top surface of the different conductive contact (not shown).

The light pipe structure 115 extends through the interconnect dielectric structure 201 and terminates below a bottom surface of the bottommost conductive wiring layer 210a. In some embodiments, the light pipe structure 115 has a first width $W_1$ greater than a second width $W_2$. Incident radiation disposed upon the interconnect structure 107 directly above the photodetector 104 is confined to the light pipe structure 115 (e.g., due to total internal reflection) and is guided to the photodetector 104. The bottom surface 115b of the light pipe structure 115 is disposed below the bottom surface of the bottommost conductive wiring layer 210a by a distance $d_1$. Thus, a thickness $t_1$ of the lower ILD structure 109 between a bottom surface of the lower etch stop structure 114 and the front side surface 102f of the semiconductor substrate 102 is reduced. This, in part, mitigates reflection and/or absorption of the incident radiation by the lower ILD structure 109, thereby increasing a QE of the image sensor 200a.

The first width $W_1$ is defined between opposing sidewalls 114s1, 114s2 of the lower etch stop structure 114. In some embodiments, the first width $W_1$ is within a range of approximately 1 to 3.5 micrometers. The second width $W_2$ is defined between opposing sidewalls 118s1, 118s2 of the upper etch stop structure 118. In some embodiments, the second width $W_2$ is within a range of approximately 1 to 3 micrometers. In further embodiments, if the second width $W_2$ is 1 micrometer or greater, then incident radiation disposed upon the photodetector 104 will be increased while reducing reflection of the incident radiation away from the photodetector 104 by the interconnect structure 107. This, in part, will increase the overall QE of the image sensor 200a. In yet further embodiments, if the second width $W_2$ is 3 micrometers or less, then incident radiation disposed upon the photodetector 104 will be further increases while reducing a cost associated with forming the light pipe structure 115. This, in part, will further increase the overall QE of the image sensor 200a. In some embodiments, an absolute value of the difference between the first width $W_1$ and the second width $W_2$ (i.e., $|W_1-W_2|$) is less than 0.5 micrometers. In further embodiments, if the aforementioned difference is greater than, for example, 0.5 micrometers, then a structural integrity of the light pipe structure 115 may be reduced.

Further, in some embodiments, the photodetector 104 may be in an array of photodetectors, such that the array comprises a plurality of photodetectors disposed in rows and columns. A light pipe structure directly overlies each photodetector in the array. The light pipe structures may each be configured as the light pipe structure 115, such that a bottom surface of each light pipe structure extends through the interconnect dielectric structure 201 and terminates below a bottom surface of the bottommost conductive wiring layer 210a. This, in part, may increase photodetector uniformity across the array (e.g., a first photodetector may receive about a same amount of incident radiation as an adjacent second photodetector), thereby increasing an overall QE of the image sensor 200a.

An anti-reflection layer 216 contacts the light pipe structure 115 and is configured to reduce the amount of incident radiation reflected by the interconnect structure 107. In some embodiments, the anti-reflection layer 216 may, for example, be or comprise an oxide, a high-k dielectric, a nitride, or the like. A color filter 226 is disposed over the anti-reflection layer 216. The color filter 226 is configured to transmit specific wavelengths of incident radiation while blocking other wavelengths of radiation. Further, a microlens 224 overlies the color filter 226 and is configured to focus the incident radiation towards the photodetector 104.

Figure 2B:
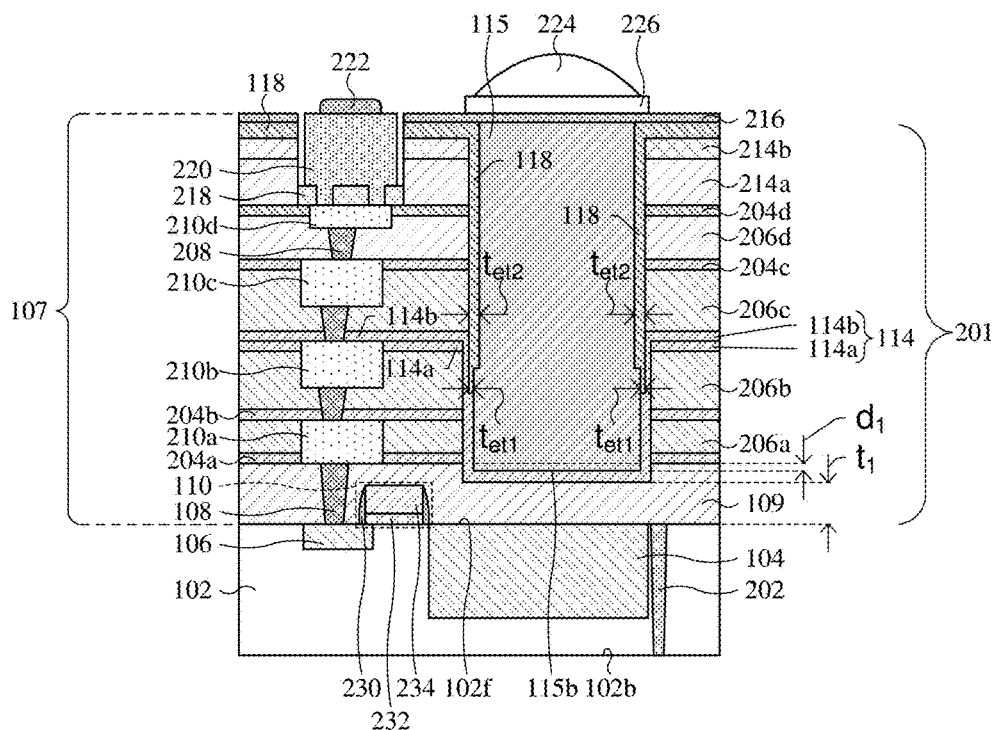

With reference to FIG. 2B, a cross-sectional view of an image sensor 200b according to some alternative embodiments of the image sensor 200a of FIG. 2A is provided, in which the lower etch stop structure 114 comprises a first lower etch stop layer 114a underlying a second lower etch stop layer 114b. The second lower etch stop layer 114b has a U-shaped profile directly above the photodetector 104. The lower etch stop structure 114 overlies a second bottommost conductive wiring layer 210b. A bottom surface of the upper etch stop structure 118 is disposed above the top surface of the bottommost conductive wiring layer 210a. The upper etch stop structure 118 has a first thickness $t_{et1}$ between the top surface of the bottommost conductive wiring layer 210a and the top surface of the lower etch stop structure 114. In some embodiments, the first thickness $t_{et1}$ is within a range of about 125 to 375 Angstroms. Further, the upper etch stop structure 118 has a second thickness $t_{et2}$ above the bottom surface of the second bottommost conductive wiring layer 210b. In some embodiments, the second thickness $t_{et2}$ is within a range of about 250 to 750 Angstroms.

Figure 3:
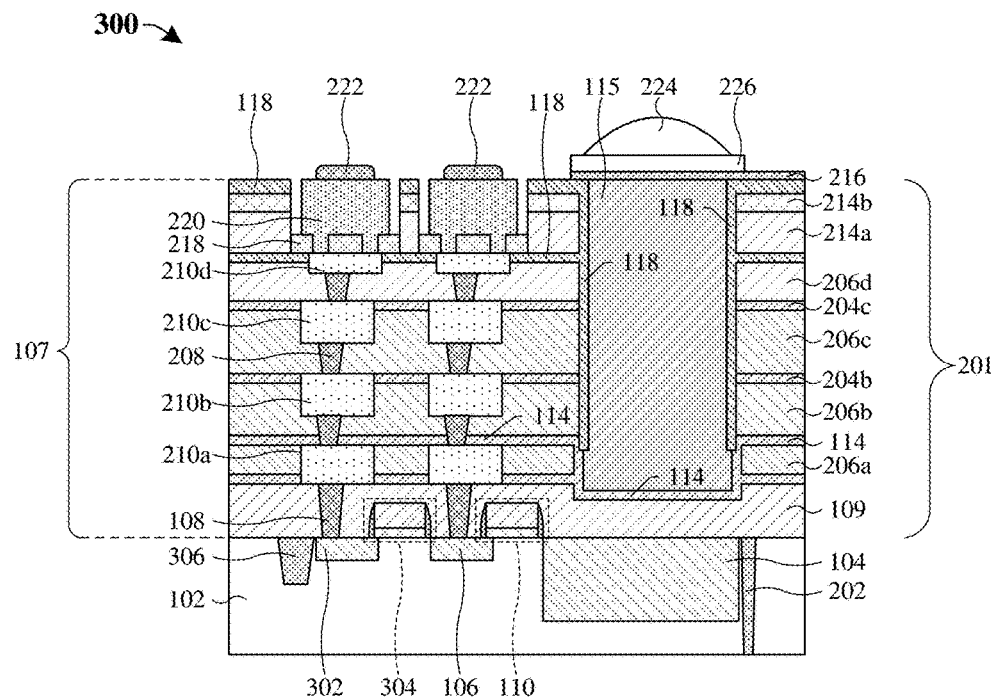
FIG. 3 illustrates a cross-sectional view of some embodiments of an image sensor comprising a light pipe structure over a photodetector and further comprising transistors adjacent to the photodetector, where the transistors are electrically coupled to overlying bond pads through an interconnect structure.

With reference to FIG. 3, a cross-sectional view of an image sensor 300 according to some alternative embodiments of the image sensor 200a of FIG. 2A is provided, in which a reset transistor 304 is disposed between the floating diffusion node 106 and a contact region 302. In some embodiments, the reset transistor 304 comprise a reset gate electrode overlying a reset gate dielectric and further comprises sidewall spacers abutting the reset gate electrode and dielectric. In some embodiments, the contact region 302 is electrically coupled to a power supply (e.g., a DC power supply) supplying a reset voltage (e.g., 5 volts) by way of the interconnect structure 107. In further embodiments, a reset gate voltage is applied to the reset gate electrode to apply the reset voltage to the floating diffusion node 106. A conductive contact 108, conductive wiring layers 210a-d, conductive vias 208, and a bond pad 220 overlie the contact region 302 and may, for example, be configured to electrically couple the contact region 302 to the power supply (not shown). A shallow isolation structure 306 is adjacent to the contact region 302 and is configured to electrically isolate the contact region 302 from adjacent semiconductor devices, adjacent contact regions, and/or adjacent source/drain regions (not shown). In some embodiments, the shallow isolation structure 306 may, for example, be a shallow trench isolation (STI) structure, a deep trench isolation (DTI) structure, or the like.

Figure 4:
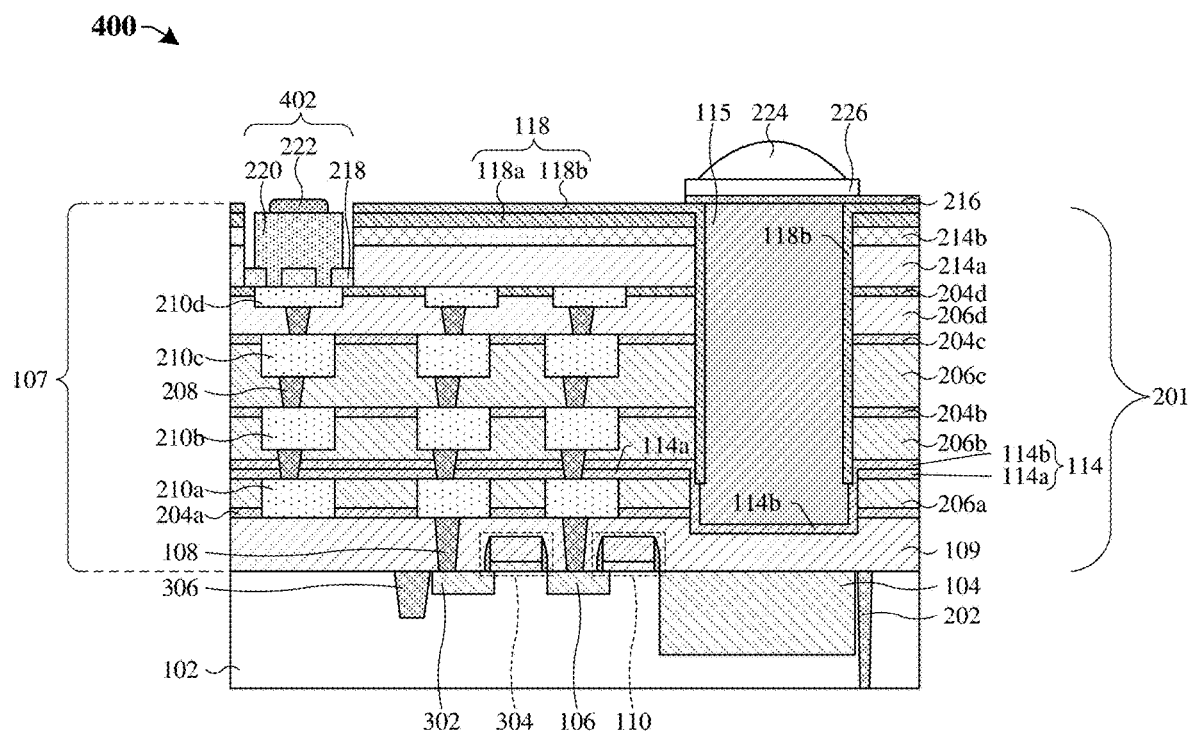
FIGS. 4-15 illustrate a series of cross-sectional views of some embodiments of a method for forming an image sensor that comprises a light pipe structure over a photodetector and further comprises transistors adjacent to the photodetector.

With reference to FIG. 4, a cross-sectional view of an image sensor 400 according to some alternative embodiments of the image sensor 300 of FIG. 3 is provided, in which the lower etch stop structure 114 comprises a first lower etch stop layer 114a underlying a second lower etch stop layer 114b. The upper etch stop structure 118 comprises a first upper etch stop layer 118a underlying a second upper etch stop layer 118b. Further, an interconnect column 402 comprising conductive wiring layers 210a-d, conductive vias 208, a bond pad 220, and a solder bump 222 is laterally offset from the transfer and reset transistors 110, 304. In some embodiments, the bond pad 220 is electrically coupled to the floating diffusion node 106 by way of the interconnect structure 107. An inter-wire buffer layer 204d is disposed between the bond pad 220 and the conductive vias 208. In some embodiments, the inter-wire buffer layer 204d comprises a same material as the upper etch stop structure 118.

FIGS. 5-15 illustrate cross-sectional views 500-1500 of some embodiments of a method of forming an image sensor device according to aspects of the present disclosure. Although the cross-sectional views 500-1500 shown in FIGS. 5-15 are described with reference to a method, it will be appreciated that the structures shown in FIGS. 5-15 are not limited to the method but rather may stand alone separate of the method. Although FIGS. 5-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 5-15 may, for example, be employed to form the image sensor 400 of FIG. 4.

Figure 5:
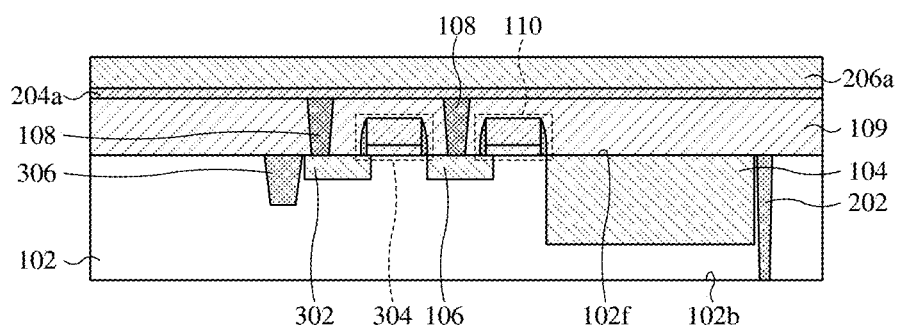

As shown in cross-sectional view 500 of FIG. 5, a semiconductor substrate 102 is provided and a deep isolation structure 202 and a shallow isolation structure 306 are formed on a front side surface 102*f* of the semiconductor substrate 102. In some embodiments, the semiconductor substrate 102 may be, for example, a bulk substrate (e.g., a bulk silicon substrate), a silicon-on-insulator (SOI) substrate, or some other suitable substrate. In some embodiments, before forming the deep isolation structure 202 and the shallow isolation structure 306, a first implant process is performed to dope the semiconductor substrate 102 with a first doping type (e.g., P-type). In some embodiments, a process for forming the deep isolation structure 202 and/or the shallow isolation structure 306 may comprise: 1) selectively etching the semiconductor substrate 102 to form a trench in the semiconductor substrate 102 that extends into the semiconductor substrate 102 from the front side surface 102*f* of the semiconductor substrate 102; and 2) filling (e.g., by chemical vapor deposition (CVD), physical vapor deposition (PVD), atomic layer deposition (ALD), thermal oxidation, sputtering, etc.) the trench with a dielectric material. In further embodiments, the semiconductor substrate 102 is selectively etched by forming a masking layer (not shown) on the front side surface 102*f* of the semiconductor substrate 102, and subsequently exposing the semiconductor substrate 102 to an etchant configured to selectively remove unmasked portions of the semiconductor substrate 102. In yet further embodiments, the dielectric material may comprise an oxide (e.g., silicon oxide), a nitride, or the like.

Also shown in FIG. 5, a photodetector 104 is formed in the semiconductor substrate 102. The photodetector 104 is a region of the semiconductor substrate 102 having a second doping type (e.g., N-type) opposite the first doping type. In some embodiments, the photodetector 104 may be formed by a selective ion implantation process that utilizes a masking layer (not shown) on the front side surface 102*f* of the semiconductor substrate 102 to selectively implant ions into the semiconductor substrate 102. Further, the transfer and reset transistors 110, 304 are formed over the front side surface 102*f* of the semiconductor substrate 102. In some embodiments, a process for forming the transfer and/or reset transistors 110, 304 comprises depositing and/or growing (e.g., by CVD, PVD, ALD, thermal oxidation, sputtering, etc.) a gate dielectric layer on the front side surface 102*f* of the semiconductor substrate 102. Next, a gate electrode layer may be deposited on the gate dielectric layer. Subsequently, the gate dielectric and electrode layers are patterned (e.g., by a photolithography/etching process) to form gate dielectrics and gate electrodes, respectively. Further, spacers may, for example, be formed by: 1) depositing (e.g., by CVD, PVD, ALD, sputtering, etc.) a spacer layer over the front side surface 102*f* of the semiconductor substrate 102, the gate dielectrics, and the gate electrodes; and 2) etching back the spacer layer to remove the spacer layer from horizontal surfaces. In further embodiments, the spacer layer may comprise a nitride, an oxide, or some other dielectric. In further embodiments, the gate electrode layer may comprise, for example, polysilicon, aluminum or the like. In yet further embodiments, the gate dielectric layer may comprise, for example, an oxide, a high-k dielectric, or the like.

Also shown in FIG. 5, the contact region 302 and the floating diffusion node 106 are formed in the semiconductor substrate 102 on opposing sides of the reset transistor 304. In some embodiments, the contact region 302 and the floating diffusion node 106 are regions of the semiconductor substrate 102 having the second doping type (e.g., N-type). In some embodiments, the contact region 302 and the floating diffusion node 106 may be formed by a selective ion implantation process that utilizes a masking layer (not shown) disposed on the front side surface 102*f* of the semiconductor substrate 102 to selectively implant n-type dopants (e.g., phosphorus) into the semiconductor substrate 102. Further, a lower inter-level dielectric (ILD) structure 109 is formed over the front side surface 102*f* of the semiconductor substrate 102. In some embodiments, the lower ILD structure 109 may, for example, be or comprise one or more dielectric materials, such as an oxide, silicon oxide, a low-k dielectric, or the like, and/or may, for example, have a thickness within a range of about 2500 to 5000 Angstroms. Formation of the lower ILD structure 109 may, for example, comprise deposition followed by a planarization to flatten a top surface of the lower ILD structure 109.

Furthermore, conductive contacts 108 are formed within the lower ILD structure 109 over the contact region 302 and the floating diffusion node 106. In some embodiments, the conductive contacts 108 are formed by a single damascene process. In some embodiments, conductive contacts 108 are formed over the transfer and reset transistors 110, 304 (not shown). In some embodiments, the single damascene process comprises patterning a dielectric layer and/or structure (e.g., the lower ILD structure 109) with openings for a single layer of conductive features (e.g., layer of contacts, vias, or wires), and filling the openings with conductive materials to form the single layer of conductive features. In further embodiments, a planarization process (e.g., a chemical mechanical planarization (CMP) process) is performed such that a top surface of the ILD structure 109 is aligned with top surfaces of the conductive contacts 108. Additionally, an inter-wire buffer layer 204*a* is formed over the lower ILD structure 109 and an inter-metal dielectric (IMD) layer 206*a* is formed over the inter-wire buffer layer 204*a*. In some embodiments, the formation of the ILD structure 109, the inter-wire buffer layer 204*a*, and/or the IMD layer 206*a* may, for example, utilize CVD, PVD, ALD, and/or sputtering. In yet further embodiments, the inter-wire buffer layer 204*a* may, for example, be or comprise silicon carbide, or the like and/or may, for example, have a thickness within a range of about 200 to 500 Angstroms. In further embodiments, the IMD layer 206*a* may, for example, be or comprise an oxide, silicon oxide, a low-k dielectric, or the like and/or may, for example, have a thickness within a range of about 1000 to 3000 Angstroms.

Figure 6:
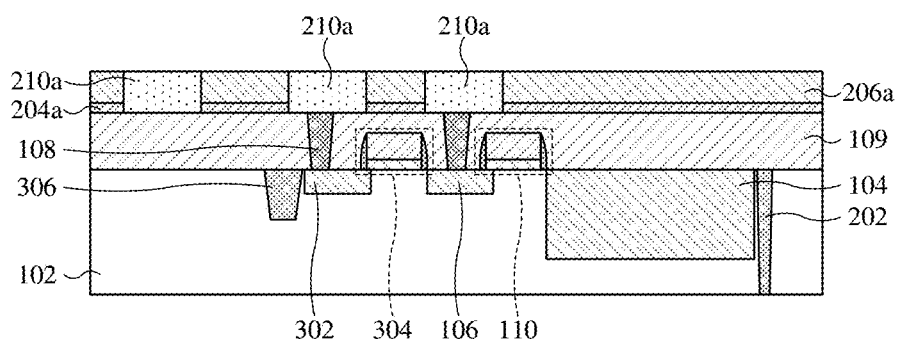

As shown in cross-sectional view 600 of FIG. 6, a bottommost conductive wiring layer 210*a* is formed over the lower ILD structure 109. In some embodiments, the bottommost conductive wiring layer 210*a* is formed, for example, by a single damascene process. In some embodiments, the bottommost conductive wiring layer 210*a* may, for example, be or comprise a metal material, such as copper, tungsten, aluminum, or the like.

Figure 7:
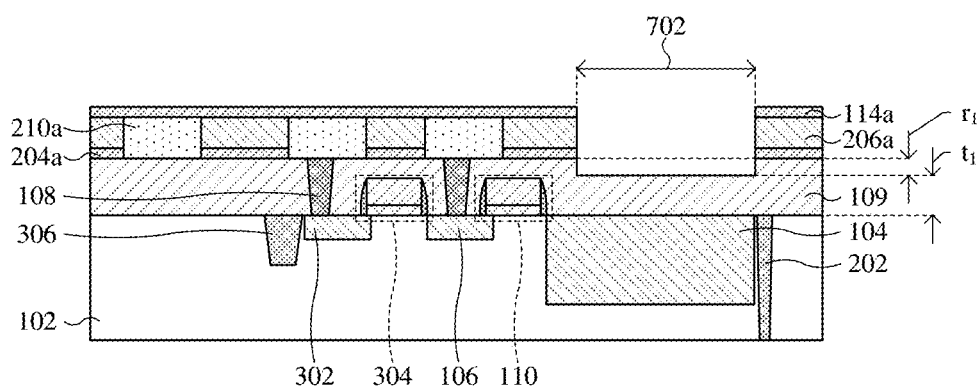

As shown in cross-sectional view 700 of FIG. 7, a first lower etch stop layer 114a is formed over the IMD layer 206a. Subsequently, an etching process is performed to define a first opening 702 above the photodetector 104. In some embodiments, the etching process includes forming a masking layer over the first lower etch stop layer 114a, selectively exposing the layers below the masking layer to one or more etchants, and removing the masking layer (not shown). In some embodiments, the etching process removes a portion of the ILD structure 109, such that an upper surface of the ILD structure 109 is recessed below a bottom surface of the bottommost conductive wiring layer 210a by a recess distance $r_1$. In some embodiments, the recess distance $r_1$ is, for example, within a range of approximately 500 to 2000 Angstroms. A thickness $t_1$ of the ILD structure 109 is defined between the upper surface of the ILD structure 109 and a top surface of the semiconductor substrate 102. In some embodiments, the thickness $t_1$ is, for example, within a range of approximately 500 to 2000 Angstroms. A reduction of the thickness $t_1$ of the ILD structure 109 over the photodetector 104 may, for example, increase an amount of incident radiation the photodetector 104 may receive, thereby increasing a QE of the photodetector 104.

In some embodiments, the etching process utilized to form the first opening 702 may, for example, be a low power dry etch process (e.g., the low power etch process may have a low power within a range of about 200 to 400 Watts (W)). Further, the one or more etchants utilized in the low power etch process may, for example, be or comprise a fluorine base chemical (e.g., perfluorocyclobutane ($C_4F_8$), hexafluorocyclobutene ($C_4F_6$)), argon, helium, and/or the like. The use of the low power dry etch process and the one or more etchants mitigates damage to the semiconductor substrate 102 and/or mitigates an accumulation of electrons on the semiconductor substrate 102. This, in part, decreases the presence of a dark current and/or a white pixel in the photodetector 104.

Figure 8:
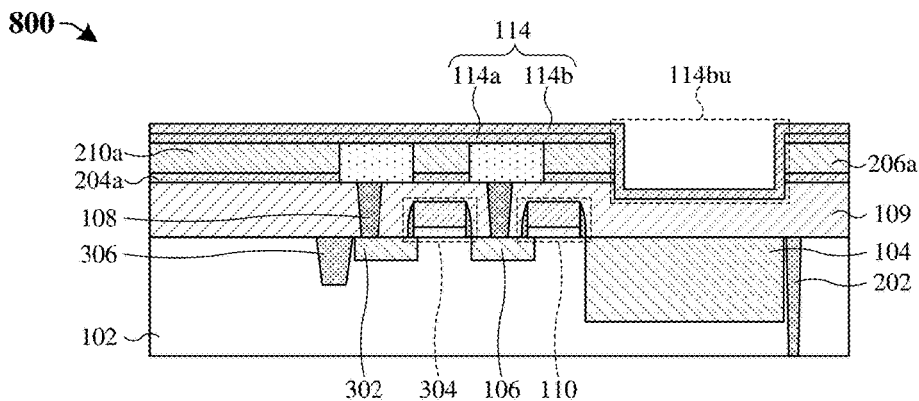

As shown in cross-sectional view 800 of FIG. 8, a second lower etch stop layer 114b is formed over the first lower etch stop layer 114a and within the first opening (702 of FIG. 7). In some embodiments, the first and second lower etch stop layers 114a, 114b define a lower etch stop structure 114. In further embodiments, the first and second lower etch stop layers 114a, 114b respectively comprise silicon carbide and are respectively formed to a thickness within a range of about 200 to 500 Angstroms. The second lower etch stop layer 114b has a U-shaped segment 114bu directly overlying the photodetector 104.

Figure 9:
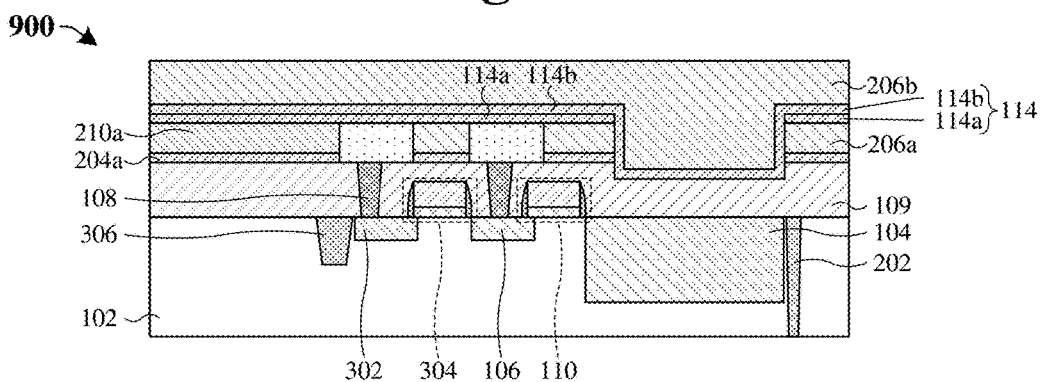

As shown in cross-sectional view 900 of FIG. 9, a second IMD layer 206b is formed over the lower etch stop structure 114. In some embodiments, the second IMD layer 206b comprises a same material as the IMD layer 206a. The second IMD layer 206b fills the U-shaped segment (114bu of FIG. 8) of the second lower etch stop layer 114b. Formation of the second IMD layer 206b may, for example, comprise deposition followed by a planarization to flatten a top surface of the second IMD layer 206b.

Figure 10:
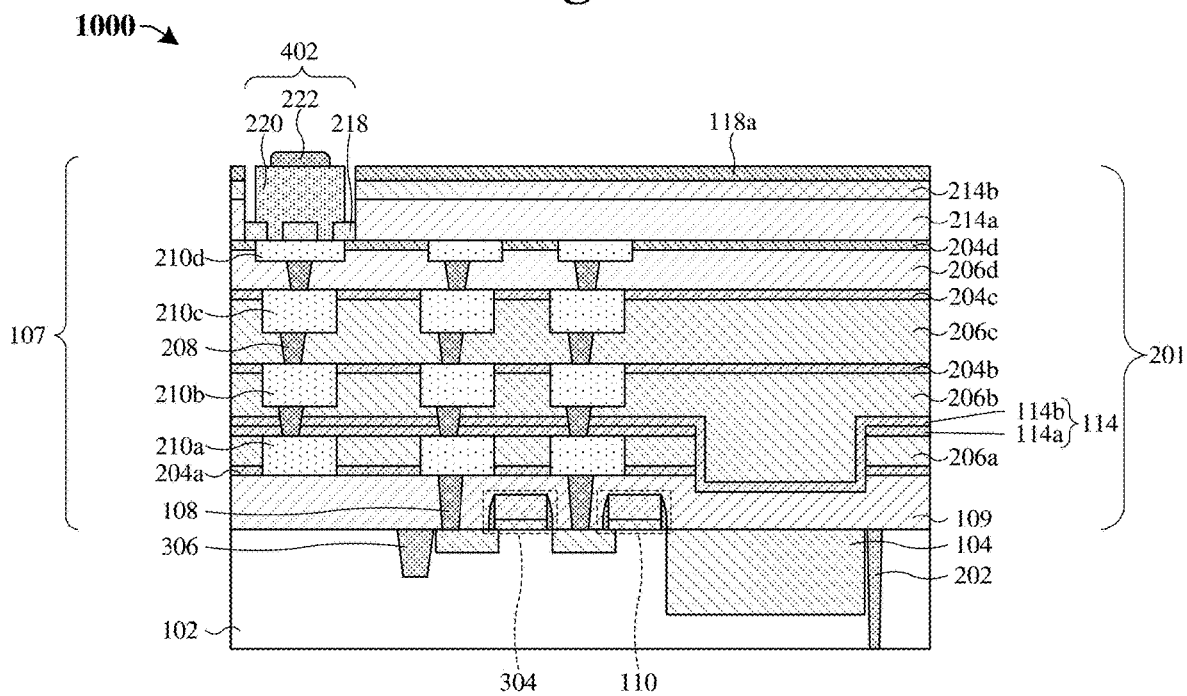

As shown in cross-sectional view 1000 of FIG. 10, conductive layers and dielectric layers of an interconnect structure 107 are formed over the semiconductor substrate 102. An interconnect dielectric structure 201 comprises inter-wire buffer layers 204a-d, IMD layers 206a-d, passivation layers 214a-b, and a first upper etch stop layer 118a. In some embodiments, the dielectric layers within the interconnect dielectric structure 201 respectively may, for example, be formed by CVD, PVD, ALD, thermal oxidation, sputtering, etc. In some embodiments, the first upper etch stop layer 118a may, for example, be or comprise silicon nitride and/or may, for example, be formed to a thickness within a range of about 250 to 750 Angstroms. The conductive layers of the interconnect structure 107 comprise conductive wiring layers 210a-d, and conductive vias 208 formed within the interconnect dielectric structure 201. In some embodiments, the conductive wiring layers 210a-d and/or the conductive vias 208 may, for example, be formed by a single or a dual damascene process. In some embodiments, the dual damascene process comprises depositing a dielectric layer, patterning the dielectric layer with openings for two layers of conductive features (e.g., a layer of vias and a layer of wires), and filling the openings with conductive material to form the two layers of conductive features. The dielectric layer may, for example, correspond to one of the layers in the interconnect dielectric structure 201. In further embodiments, a bond pad 220 is formed over an interconnect column 402. A pad dielectric layer 218 is formed between the bond pad 220 and an uppermost conductive wiring layer 210d. A solder bump 222 is formed over the bond pad 220. The interconnect column 402 is laterally offset from the transfer and reset transistors 110, 304. In some embodiments, the bond pad 220, the pad dielectric layer 218, and solder bump 222 may be formed above the transfer and/or reset transistors 110, 304 (not shown).

In some embodiments, a process for forming the bond pad 220 and the pad dielectric layer 218 may include: 1) patterning the passivation layers 214a-b and the first upper etch stop layer 118a to define a bond pad opening (not shown); 2) lining the bond pad opening with the pad dielectric layer 218; 3) selectively etching (e.g., by a masking layer (not shown)) the pad dielectric layer 218 to form openings that expose an upper surface of the uppermost conductive wiring layer 210d and remove the pad dielectric layer 218 from sidewalls of the bond pad opening; 4) selectively forming the bond pad 220 over the pad dielectric layer 218, such that sidewalls of the bond pad 220 are laterally offset sidewalls of the bond pad opening by a non-zero distance. In some embodiments, step 4) in the aforementioned process may be achieved by forming the bond pad 220 over the pad dielectric layer 218 and subsequently selectively etching the bond pad 220 by a masking layer (not shown).

Figure 11:
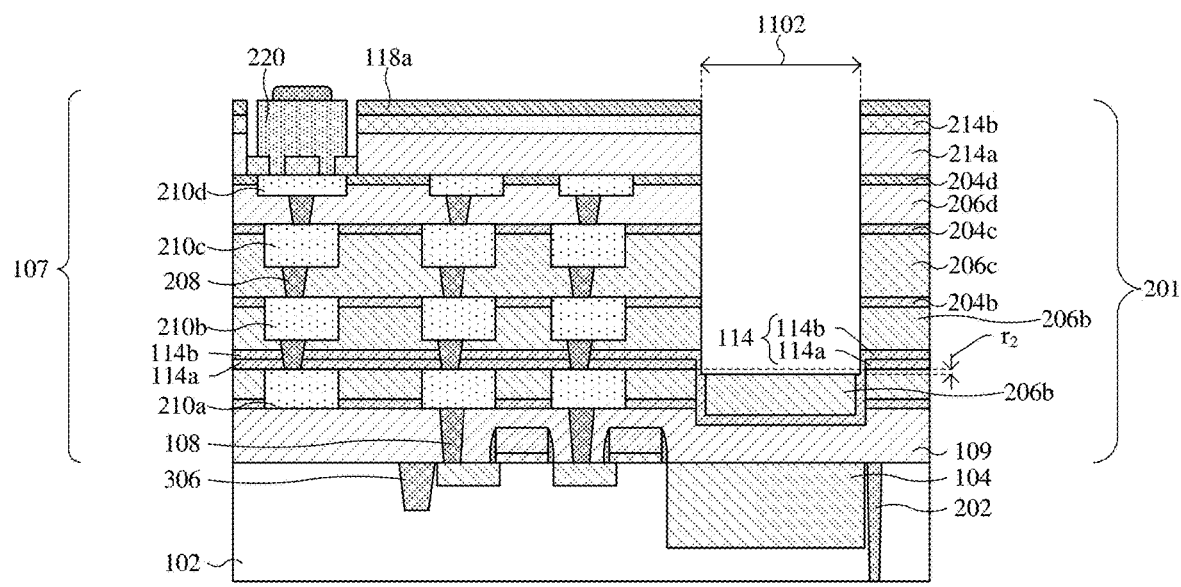

As shown in cross-sectional view 1100 of FIG. 11, an etching process is performed to define a second opening 1102 in the interconnect dielectric structure 201 above the photodetector 104. In some embodiments, the etching process includes forming a masking layer over the first upper etch stop layer 118a, selectively exposing layers below the masking layer to one or more etchants, and subsequently removing the masking layer (not shown). In some embodiments, the etching process removes a portion of the second IMD layer 206b and a portion of the second lower etch stop layer 114b, such that an upper surface of the second IMD layer 206b is recessed below a top surface of the bottommost conductive wiring layer 210a by a recess distance $r_2$. In some embodiments, the recess distance $r_2$ is within a range of approximately 100 to 400 Angstroms.

In some embodiments, the etching process utilized to form the second opening 1102 may, for example, be a high power dry etch process (e.g., the high power dry etch process may have a high power within a range of about 1000 to 2500 W). Further, the one or more etchants utilized in the high power dry etch process may, for example, be or comprise a fluorine base chemical (e.g., perfluorocyclobutane ($C_4F_8$), hexafluorocyclobutene ($C_4F_6$)), argon, helium, and/or the like. A thickness and configuration of the lower etch stop structure 114 and/or the second IMD layer 206b mitigates an accumulation of electrons on the semiconductor substrate 102, and/or a damage on a crystalline structure of the semiconductor substrate 102 during the high power etch process. This, in part, decreases the presence of a dark current and/or a white pixel in the photodetector 104.

Figure 12:
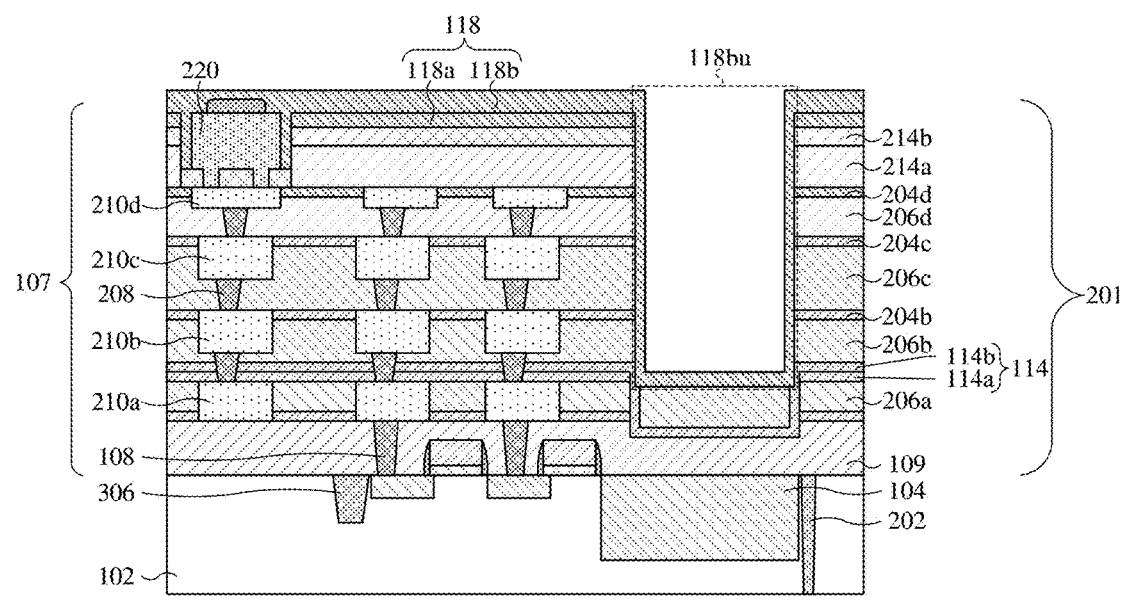

As shown in cross-sectional view 1200 of FIG. 12, a second upper etch stop layer 118b is formed over the first upper etch stop layer 118a and within the second opening (1102 of FIG. 11). In some embodiments, the first and second upper etch stop layers 118a, 118b define an upper etch stop structure 118. In further embodiments, the first and second upper etch stop layers 118a, 118b respectively comprise silicon nitride and/or are respectively formed to a thickness within a range of about 250 to 750 Angstroms. The second upper etch stop layer 118b has a U-shaped segment 118bu directly overlying the photodetector 104.

Figure 13:
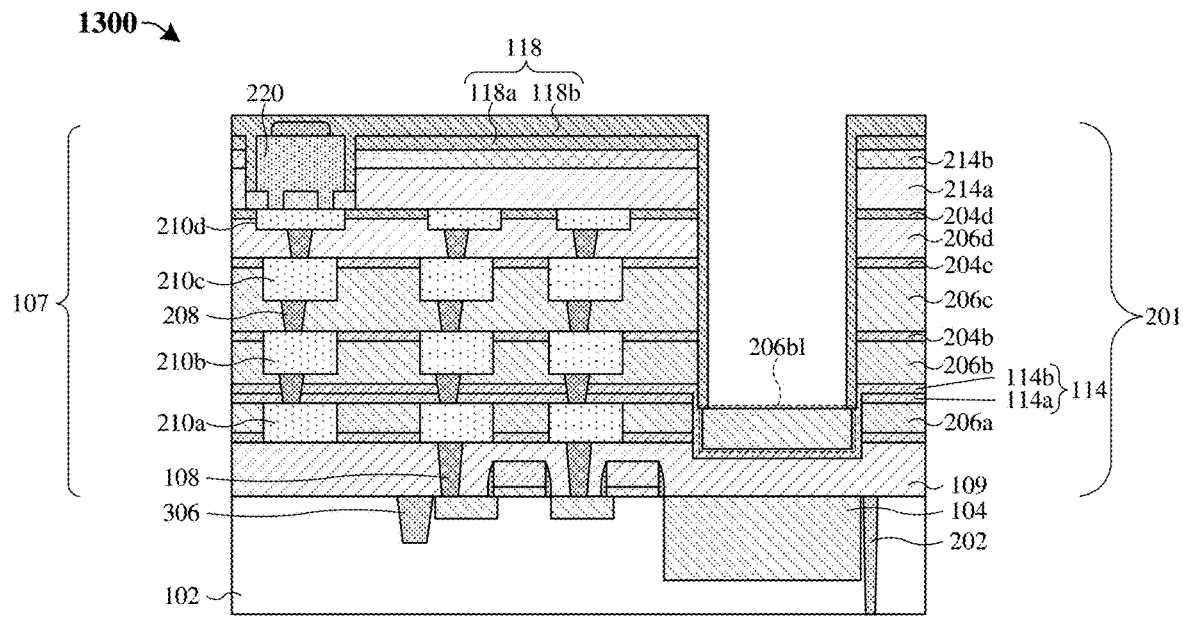

As shown in cross-sectional view 1300 of FIG. 13, an etching process is performed to remove a bottom segment of the upper etch stop structure 118 and to expose the second IMD layer 206b. In some embodiments, the etching process includes forming a masking layer over the second upper etch stop layer 118b, selectively exposing the second upper etch stop layer 118b to one or more etchants according to the masking layer, and subsequently removing the masking layer (not shown). In alternative embodiments, the etching process comprises an etch back and hence does not rely upon a masking layer. The etching process exposes an upper surface of a lower segment 206bl of the second IMD layer 206b.

In some embodiments, the etching process utilized to remove the lower segment of the U-shaped segment (118bu of FIG. 12) may, for example, be a low power dry etch process (e.g., the low power dry etch process may have a low power within a range of about 200 to 400 W). Further the one or more etchants utilized in the lower power etch process may, for example, be or comprise fluoromethane (e.g., CHF, CHF$_3$, etc.), or the like. The use of the low power dry etch process and the one or more etchants mitigates an accumulation of electrons on the semiconductor substrate 102. This, in part, decreases the presence of a dark current and/or a white pixel in the photodetector 104. Further, the second upper etch stop layer 118b may be configured to protect the interconnect dielectric structure 201 from the low power dry etch process, thereby mitigating physical bombardment from ions of the one or more etchants on the dielectric layers in the interconnect dielectric structure 201.

Figure 14:
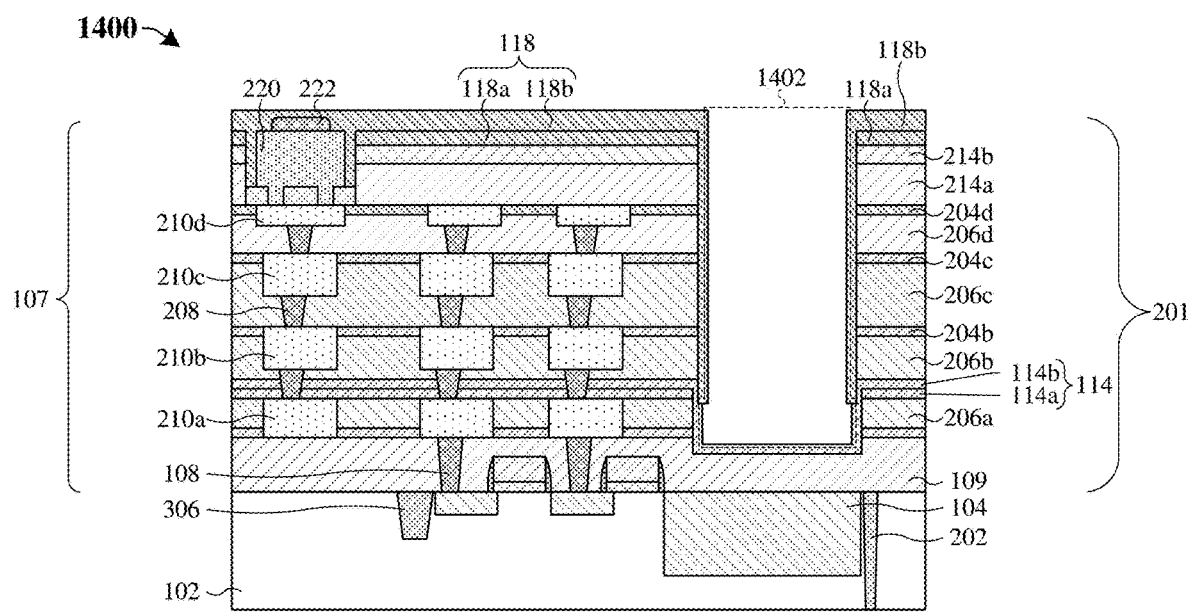

As shown in cross-sectional view 1400 of FIG. 14, an etching process is performed to remove the lower segment (206bl of FIG. 13) of the second IMD layer 206b, thereby defining a light pipe opening 1402. In some embodiments, the etching process is a wet etch process. Further, the wet etch process may, for example, utilize one or more etchants (e.g., hydrogen fluoride). In some embodiments, the second upper etch stop layer 118b covers the solder bump 222, such that the second upper etch stop layer 118b covers and protects the solder bump 222 and the bond pad 220 from the one or more etchants during the wet etch process. Further, the wet etch process is able to form the light pipe opening 1402 while avoiding plasma damage that may occur during a dry etching process, thereby further mitigating the accumulation of electrons on the semiconductor substrate 102.

Figure 15:
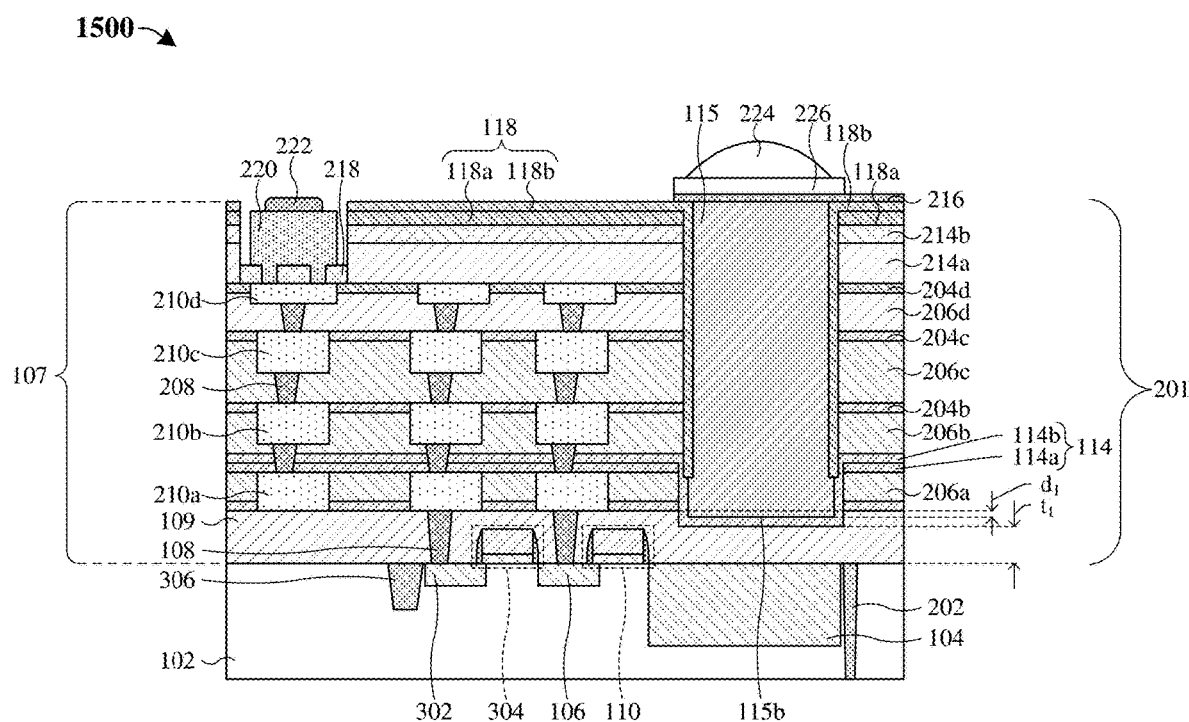

As shown in cross-sectional view 1500 of FIG. 15, a light pipe structure 115 is formed within the light pipe opening (1402 of FIG. 14). A bottom surface 115b of the light pipe structure 115 extends below a bottom surface of the bottommost conductive wiring layer 210a by a distance d$_1$. In some embodiments, the distance d$_1$ is within a range of about 50 to 1500 Angstroms. In some embodiments, if the distance d$_1$ is small (e.g., less than about 50 Angstroms), then a height of the light pipe structure 115 is decreased. This, in part, may reduce incident radiation 120 disposed upon the photodetector 104, thereby reducing a quantum efficiency (QE) of the image sensor 100. In further embodiments, if the distance d$_1$ is large (e.g., greater than about 1500 Angstroms), then physical bombardment (e.g., from ions of a plasma used during a formation of the light pipe structure 115) may damage the interconnect structure 107 and/or a crystalline structure of the semiconductor substrate 102. This, in part, may reduce a structural integrity of the interconnect structure 107, increase a dark current in the photodetector 104, and/or a number of white pixels in the image sensor 100. In some embodiments, the low power dry etch process and the lower etch stop structure 114 facilitates a high degree of control over a height of the light pipe structure 115. Further, this process may be completed for a plurality of light pipe structures 115, such that each light pipe structure 115 may, for example, have approximately a same height.

Also shown in FIG. 15, after forming the light pipe structure 115, a removal process is performed to remove the second upper etch stop layer 118b over and/or around the bond pad 220. In some embodiments, the removal process includes forming a masking layer over the second upper etch stop layer 118b, performing an etching process according to the masking layer, and subsequently removing the masking layer (not shown). In further embodiments, the removal process includes reducing a thickness of the second upper etch stop layer 118b overlying the passivation layers 214a-b. Further, an anti-reflection layer 216 is formed over the light pipe structure 115. A color filter 226 (e.g., a red color filer, a blue color filter, a green color filer, etc.) is formed over the anti-reflection layer 216. Further, a micro-lens 224 is formed over the color filter 226.

Figure 16:
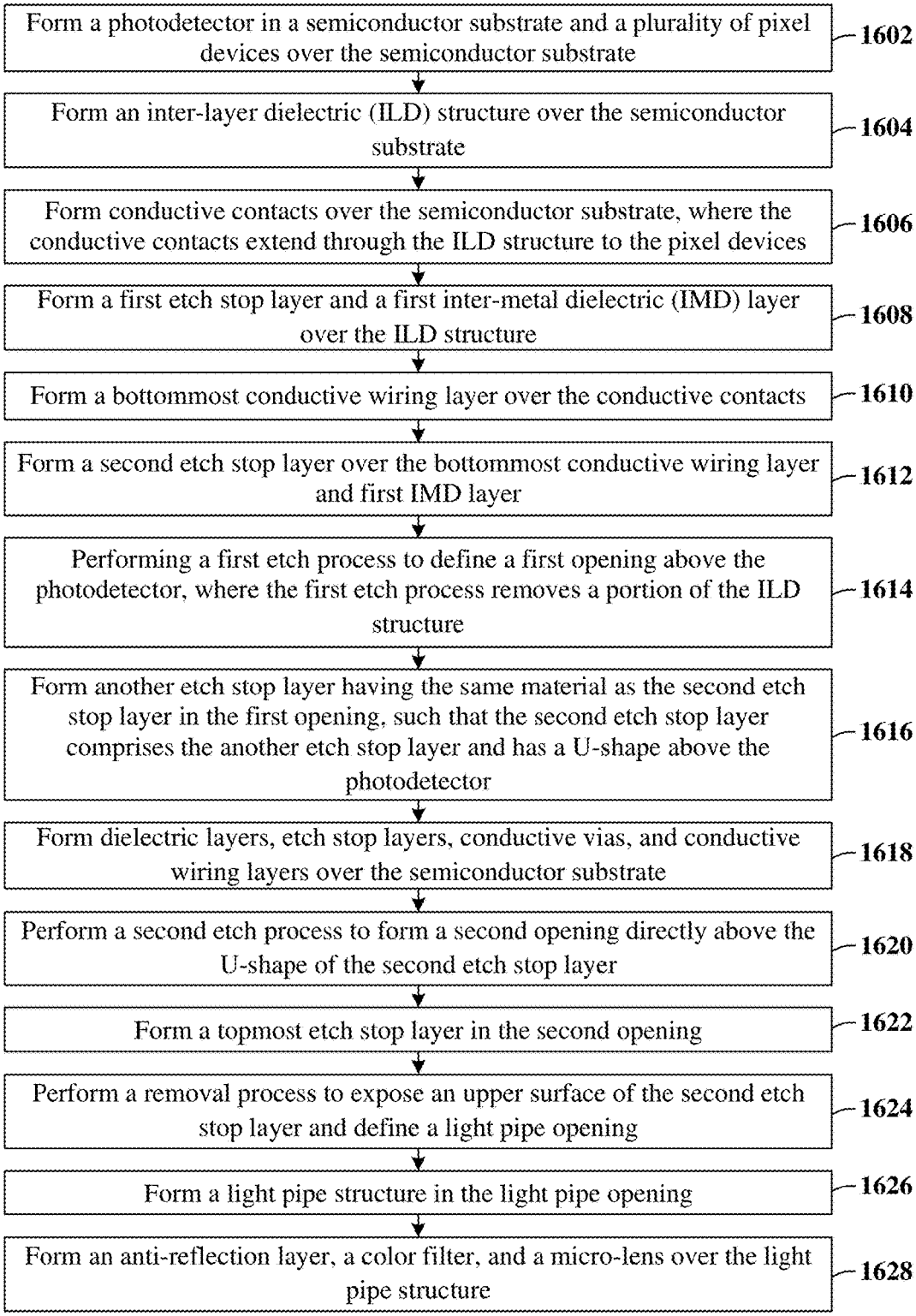
FIG. 16 illustrates a block diagram of some embodiments of the method of FIGS. 4-15.

FIG. 16 illustrates a method 1600 of forming an image sensor device that includes a light pipe structure over a photodetector and transistors adjacent to the photodetector according to the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, a photodetector is formed in a semiconductor substrate and a plurality of pixel devices are formed over the semiconductor substrate. FIG. 5 illustrates a cross-sectional view 500 corresponding to some embodiments of act 1602.

At act 1604, an inter-layer dielectric (ILD) structure is formed over the semiconductor substrate. FIG. 5 illustrates a cross-sectional view 500 corresponding to some embodiments of act 1604.

At act 1606, conductive contacts are formed over the semiconductor substrate, such that the conductive contacts extend through the ILD structure to the pixel devices. FIG. 5 illustrates a cross-sectional view 500 corresponding to some embodiments of act 1606.

At act 1608, a first etch stop layer and a first inter-metal dielectric (IMD) layer are formed over the ILD structure.

FIG. 5 illustrates a cross-sectional view 500 corresponding to some embodiments of act 1608.

At act 1610, a bottommost conductive wiring layer is formed over the conductive contacts, recessed into the first IMD layer. FIG. 6 illustrates a cross-sectional view 600 corresponding to some embodiments of act 1610.

At act 1612, a second etch stop layer is formed over the bottommost conductive wiring layer and first IMD layer. FIG. 7 illustrates a cross-sectional view 700 corresponding to some embodiments of act 1612.

At act 1614, a first etch process is performed to define a first opening above the photodetector, such that the first etch process removes a portion of the ILD structure. FIG. 7 illustrates a cross-sectional view 700 corresponding to some embodiments of act 1614.

At act 1616, another etch stop layer having the same material as the second etch stop layer is formed in the first opening, such that the second etch stop layer comprises the another etch stop layer and has a U-shape above the photodetector. FIG. 8 illustrates a cross-sectional view 800 corresponding to some embodiments of act 1616.

At act 1618, dielectric layers, etch stop layers, conductive vias, and conductive wiring layers are formed over the semiconductor substrate. FIGS. 9 and 10 illustrate cross-sectional views 900 and 1000 corresponding to some embodiments of act 1618.

At act 1620, a second etch process is performed to form a second opening directly above the U-shape of the second etch stop layer. FIG. 11 illustrates a cross-sectional view 1100 corresponding to some embodiments of act 1620.

At act 1622, a topmost etch stop layer is formed in the second opening. FIG. 12 illustrates a cross-sectional view 1200 corresponding to some embodiments of act 1622.

At act 1624, a removal process is performed to expose an upper surface of the second etch stop layer and define a light pipe opening. FIGS. 13 and 14 illustrate cross-sectional views 1300 and 1400 corresponding to some embodiments of act 1624.

At act 1626, a light pipe structure is formed in the light pipe opening. FIG. 15 illustrates a cross-sectional view 1500 corresponding to some embodiments of act 1626.

At act 1628, an anti-reflection layer, a color filter, and a micro-lens is formed over the light pipe structure. FIG. 15 illustrates a cross-sectional view 1500 corresponding to some embodiments of act 1628.

Accordingly, in some embodiments, the present application provides an image sensor device that includes a light pipe structure over a photodetector and transistors adjacent to the photodetector. A bottom surface of the light pipe structure is below a bottom surface of a bottommost conductive wire in an interconnect structure.

In some embodiments, the present application provides an image sensor, including a semiconductor substrate; a photodetector disposed within the semiconductor substrate; a gate electrode overlying the semiconductor substrate and bordering the photodetector; an inter-level dielectric (ILD) layer overlying the semiconductor substrate; a conductive contact within the ILD layer, wherein a bottom surface of the conductive contact is below a top surface of the gate electrode; and a light pipe structure overlying the photodetector, wherein a bottom surface of the light pipe structure is recessed below a top surface of the conductive contact.

In some embodiments, the present application provides a complementary metal-oxide-semiconductor (CMOS) image sensor, including a substrate; a photodetector disposed within the substrate; an interconnect structure comprising an inter-level dielectric (ILD) layer, an inter-metal dielectric (IMD) structure overlying the inter-level dielectric (ILD) layer, and conductive wires within the IMD structure, wherein the interconnect structure overlies the substrate and is selectively electrically coupled to the photodetector; and a light pipe structure overlying the photodetector and continuously extending from a top of the IMD structure to a point below a bottom surface of a bottommost conductive wire of the interconnect structure.

In some embodiments, the present application provides a method for forming an image sensor, the method including forming a photodetector in a semiconductor substrate; forming a lower interconnect portion of an interconnect structure over the photodetector; performing a first removal process to define a first opening overlying the photodetector in the lower interconnect portion; forming a lower etch stop layer lining the first opening, wherein the lower etch stop layer has a U-shape in the first opening; forming an upper interconnect portion of the interconnect structure over the lower etch stop layer; and forming a light pipe structure overlying the photodetector, wherein the U-shape of the lower etch stop layer extends continuously along sidewalls and a bottom surface of the light pipe structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a photodetector in a substrate;
    forming a lower interconnect portion of an interconnect structure over the photodetector;
    performing a removal process to define a first opening overlying the photodetector in the lower interconnect portion;
    forming a lower etch stop layer lining the first opening, wherein the lower etch stop layer has a U-shape in the first opening;
    forming an upper interconnect portion of the interconnect structure directly over the lower etch stop layer; and
    forming a light pipe structure overlying the photodetector, wherein the U-shape of the lower etch stop layer extends continuously along lower sidewalls and a bottom surface of the light pipe structure.

2. The method of claim 1, wherein the light pipe structure comprises upper sidewalls over the lower sidewalls, wherein a width of the light pipe structure discretely increases from the upper sidewalls of the light pipe structure in a direction towards the substrate.

3. The method of claim 1, wherein forming the lower interconnect portion comprises forming a bottommost conductive wire over the substrate, and wherein the bottom surface of the light pipe structure extends below the bottommost conductive wire.

4. The method of claim 1, wherein forming the upper interconnect portion comprises forming a topmost conductive wire over the substrate, wherein the lower etch stop layer is formed before forming the topmost conductive wire.

5. The method of claim 1, wherein the removal process includes performing a first dry etch on the lower interconnect portion, wherein forming the light pipe structure includes performing a second dry etch on the upper interconnect portion, wherein the first dry etch is performed at a first power less than a second power of the second dry etch.

6. The method of claim 5, wherein the first power is within a range of about 200 Watts to 400 Watts.

7. The method of claim 5, wherein forming the light pipe structure further includes performing a wet etch process on the upper interconnect portion after performing the second dry etch.

8. The method of claim 1, wherein forming the light pipe structure comprises:
performing a dry etch into the interconnect structure to define a light pipe opening overlying the photodetector;
forming an upper etch stop layer along sidewalls of the interconnect structure within the light pipe opening;
performing a wet etch process on the interconnect structure to expand the light pipe opening; and
forming the light pipe structure in the light pipe opening.

9. A method for forming an image sensor, the method comprising:
forming a photodetector in a substrate;
depositing a lower dielectric structure over the photodetector;
performing a first etch process on the lower dielectric structure to define an opening in the lower dielectric structure;
depositing a lower etch stop layer over the lower dielectric structure and lining the opening;
depositing an upper dielectric structure over the lower etch stop layer such that the upper dielectric structure fills the opening;
performing a patterning process to define a light pipe opening within the upper dielectric structure and over the photodetector, wherein the patterning process comprises a second etch process that is performed at a higher power than the first etch process; and
forming a light pipe structure within the light pipe opening.

10. The method of claim 9, further comprising:
forming an upper etch stop layer along sidewalls of the upper dielectric structure that define the light pipe opening, wherein the upper etch stop layer contacts the lower etch stop layer.

11. The method of claim 10, wherein the patterning process further comprises:
performing a third etch process to remove a lower segment of the upper etch stop layer.

12. The method of claim 11, wherein the third etch process is performed at a lower power than the second etch process.

13. The method of claim 11, wherein the first and third etch processes are performed at a first power within a range of about 200 Watts to 400 Watts, and wherein the second etch process is performed at a second power within a range of about 1,000 Watts to 2,500 Watts.

14. The method of claim 11, wherein the patterning process further comprises:
performing a fourth etch process to remove a lower portion of the upper dielectric structure that is disposed along sidewalls and an upper surface of the lower etch stop layer.

15. The method of claim 14, wherein the first etch process, the second etch process, and the third etch process are dry etch processes, and wherein the fourth etch process is a wet etch process.

16. A method for forming an image sensor, the method comprising:
depositing a lower dielectric structure over a substrate;
forming a lower etch stop layer over the lower dielectric structure such that the lower etch stop layer comprises a U-shaped segment over a photodetector disposed within the substrate;
depositing an upper dielectric structure over the lower etch stop layer;
forming an upper etch stop layer over the photodetector such that the upper etch stop layer continuously vertically extends from a top surface of the upper dielectric structure to a point below a top surface of the lower etch stop layer; and
forming a light pipe structure over the photodetector such that the light pipe structure contacts sidewalls of the upper etch stop layer and sidewalls of the lower etch stop layer.

17. The method of claim 16, wherein the upper etch stop layer contacts at least a portion of the U-shaped segment of the lower etch stop layer.

18. The method of claim 16, wherein the lower etch stop layer comprises a first dielectric material and the upper etch stop layer comprises a second dielectric layer different than the first dielectric material.

19. The method of claim 16, wherein the U-shaped segment of the lower etch stop layer continuously extends from opposing sidewalls of the light pipe structure to a bottom surface of the light pipe structure.

20. The method of claim 16, wherein forming the lower etch stop layer comprises performing a low power etch process on the lower dielectric structure, and wherein forming the light pipe structure comprises performing a high power etch process on the upper dielectric structure.

* * * * *